US012631697B2

(12) United States Patent     (10) Patent No.:   US 12,631,697 B2

Lim et al.     (45) Date of Patent:    May 19, 2026

(54) SYSTEM FOR CHECKING CAPACITY OF STORAGE CAPACITOR WITH HIGH RESOLUTION

(71) Applicant: FADU Inc., Seoul (KR)

(72) Inventors: Jinup Lim, Seoul (KR); Jungeui Park, Suwon-si (KR); Jaeil Lee, Gwangmyeong-si (KR); Kwanseok Jung, Seoul (KR)

(73) Assignee: FADU Inc., Seoul (KR)

( * ) Notice: Subject to any disclaimer, the term of this patent is extended or adjusted under 35 U.S.C. 154(b) by 140 days.

(21) Appl. No.: 18/397,614

(22) Filed: Dec. 27, 2023

(65) Prior Publication Data

US 2024/0241161 A1     Jul. 18, 2024

Related U.S. Application Data

(60) Provisional application No. 63/435,965, filed on Dec. 29, 2022.

(30) Foreign Application Priority Data

Dec. 29, 2022   (KR) ........................ 10-2022-0189120

(51) Int. Cl.
    *G01R 31/64*      (2020.01)
    *G01R 27/26*      (2006.01)
(52) U.S. Cl.
    CPC ............. *G01R 31/64* (2020.01); *G01R 27/26* (2013.01)
(58) Field of Classification Search
    CPC ............................ G01R 31/64; G01R 27/2605
    See application file for complete search history.

(56) References Cited

U.S. PATENT DOCUMENTS

| | | | | |
|---|---|---|---|---|
| 9,430,011 | B2 * | 8/2016 | Chiasson | ................. G06F 1/30 |
| 10,236,900 | B1 * | 3/2019 | Loveless | ................. H03K 5/24 |
| 2003/0038617 | A1 * | 2/2003 | Yaklin | ....................... G05F 3/24 |
| | | | | 327/524 |
| 2008/0232018 | A1 * | 9/2008 | Yang | ................ H02M 3/33507 |
| | | | | 361/94 |
| 2022/0122631 | A1 * | 4/2022 | Lucky | .................... G01R 27/00 |
| 2024/0113613 | A1 * | 4/2024 | Hashimoto | ............. G05F 1/565 |

FOREIGN PATENT DOCUMENTS

| | | |
|---|---|---|
| JP | 2010-230688 A | 10/2010 |
| JP | 2018-040711 A | 3/2018 |
| KR | 10-1998-0078445 A | 11/1998 |
| KR | 10-2010-0068418 A | 6/2010 |

OTHER PUBLICATIONS

Office Action issued on Apr. 15, 2023 in counterpart Korean Patent Application No. 10-2022-0189120 (4 pages Korean).

* cited by examiner

*Primary Examiner* — Jeff W Natalini
(74) *Attorney, Agent, or Firm* — NSIP Law

(57) ABSTRACT

Disclosed is a system for checking the capacity of a storage capacitor with high resolution. The system is constructed to increase the precision of correlation between a sink current and a clock frequency necessary for health check of the storage capacitor. This construction enables completion of the health check in a shorter time, minimizing both energy consumption and loss of the storage capacitor. Therefore, the system can supply sufficient energy as emergency power to a main system in an emergency power situation in which power supply is cut off.

2 Claims, 6 Drawing Sheets

131

SYSTEM FOR CHECKING CAPACITY OF STORAGE CAPACITOR WITH HIGH RESOLUTION

CROSS REFERENCE TO RELATED APPLICATIONS

This application claims the benefit under 35 USC 119(e) of U.S. Provisional Application No. 63/435,965 filed on Dec. 29, 2022, and claims the benefit under 35 USC 119(a) and 365(b) of Korean Patent Application No. 10-2022-0189120, filed on Dec. 29, 2022, in the Korean Intellectual Property Office, the entire disclosure of which is incorporated herein by reference for all purposes.

BACKGROUND OF THE INVENTION

1. Field of the Invention

The present invention relates to a system for checking the capacity of a storage capacitor with high resolution, and more specifically to a technology for checking the capacity of a storage capacitor of a power loss protection circuit that stores energy in a normal power supply state and supplies the charged energy as emergency power when the power supply is cut off.

2. Description of the Related Art

In general, a memory system including memory devices and a memory controller operates when power is supplied from the outside. Thus, data being processed may be lost when the power supply to the memory system is unintentionally cut off. In order to cope with such an emergency situation, the memory system includes an auxiliary power supply that stores energy in a storage capacitor when power is normally supplied to the memory system, immediately detects an emergency power situation in which the power supply is cut off, and uses the energy pre-charged in the capacitor to supply emergency power.

The amount of energy required in an emergency power situation is proportional to the capacity of the storage capacitor and the performance (for example, maximum charge capacity) of the storage capacitor deteriorates depending on various factors such as operating voltage, temperature, humidity, and duration of use. Thus, the charge capacity of the storage capacitor needs to be inspected regularly. This regular inspection is called a "status check" or "health check".

A discharge circuit is generally used for health check to determine the capacity of the capacitor. The discharge circuit discharges the storage capacitor for a predetermined time to determine whether the voltage of the storage capacitor is higher than a critical voltage. In this process, the discharge circuit is affected by the operating environment such as temperature, failing to ensure its accuracy for health check. When the capacity of the storage capacitor is very large, a large current sink is required to determine the capacity of the storage capacitor. As a result, a large amount of energy accumulated in the storage capacitor for an emergency power situation is consumed, causing deterioration in the efficiency and performance of a memory system.

Thus, there is an urgent need for a solution to the problems of conventional methods for checking the health of storage capacitors.

SUMMARY OF THE INVENTION

The present invention has been made in an effort to solve the problems of the prior art and one aspect of the present invention is to provide a system for checking the capacity of a storage capacitor that minimizes energy loss of the storage capacitor during the health check of the storage capacitor, enabling supply of sufficient energy as emergency power to a main system when power supply is cut off.

A further aspect of the present invention is to provide a system for checking the capacity of a storage capacitor that determines the capacity of the storage capacitor based on a sink current and clocks (CLKs) to check the health of the storage capacitor wherein the health check is completed in a shorter time by increasing the precision of correlation between the required sink current and clock frequency, minimizing energy consumption during the health check of the storage capacitor.

A system for checking the capacity of a storage capacitor according to an embodiment of the present invention is constructed to check the capacity of a storage capacitor charged by a charge circuit for a predetermined time (from T1 to T4) and includes: a pre-charging unit pre-charging the storage capacitor to boost the voltage of the storage capacitor at the first time point (T1); a discharge circuit generating a sink current to discharge the storage capacitor from the second time point (T2) so that the boosted voltage of the storage capacitor is stepped down; a time difference calculation unit calculating the time difference (T4−T3) between the third time point (T3) when the voltage of the storage capacitor is stepped down to a predetermined first voltage and the fourth time point (T4) when the voltage of the storage capacitor is continuously stepped down to a predetermined second voltage; a capacity calculation unit calculating the capacity of the storage capacitor based on the sink current and the time difference; and a control unit controlling the operations of the pre-charging unit and the discharge circuit.

According to an exemplary embodiment of the present invention, the discharge circuit may include a current sink electrically connected to the storage capacitor and a switching unit turning on/off the current sink.

According to an exemplary embodiment of the present invention, the discharge circuit may include: an OP-AMP having a non-inverting (+) input end to which a first reference voltage is applied; a first NMOS having a gate terminal connected to an output end of the OP-AMP; a variable resistor connected between a first node connecting an inverting (−) input end of the OP-AMP and a source terminal of the first NMOS and a ground; a first PMOS having a source terminal connected to a VDD voltage and connected to a drain terminal of the first NMOS via a second node connecting its drain and gate terminals; a second PMOS having a source terminal connected to the VDD voltage and a gate terminal connected to the second node; a switching PMOS constituting the switching unit and having a source terminal connected to a drain terminal of the second PMOS; a second NMOS connected to a drain terminal of the switching PMOS via a third node connecting its drain and gate terminals and having a source terminal connected to the ground; and a third NMOS having a drain terminal connected to the storage capacitor, a gate terminal connected to the third node, and a source terminal connected to the ground.

According to an exemplary embodiment of the present invention, the first reference voltage may be a band-gap reference voltage output from a band-gap reference voltage generator.

According to an exemplary embodiment of the present invention, the time difference calculation unit may include a clock generation circuit generating clock signals and a time difference calculation circuit counting the clock signals from the third time point (T3) to the fourth time point (T4) to calculate the time difference (T4–T3).

According to an exemplary embodiment of the present invention, the clock generation circuit may include: a first comparator having an inverting (–) input terminal to which a second reference voltage is applied; a second comparator having an inverting (–) input terminal to which a third reference voltage is applied and a non-inverting (+) input terminal connected to a non-inverting (+) input terminal of the first comparator via a fourth node; a first current source connected between the VDD voltage and the fourth node; a second current source connected between the fourth node and the ground, and a capacitor connected between the fourth node and the ground.

According to an exemplary embodiment of the present invention, the sink current and the clock signals may be generated by a single current source.

According to an exemplary embodiment of the present invention, the clock generation circuit may include: a first comparator having an inverting (–) input terminal to which a second reference voltage is applied; a second comparator having an inverting (–) input terminal to which a third reference voltage is applied and a non-inverting (+) input terminal connected to a non-inverting (+) input terminal of the first comparator via a fourth node; a third PMOS having a source terminal connected to the VDD voltage and a gate terminal connected to the second node; a fourth NMOS having a source terminal connected to the ground and connected to a drain terminal of the third PMOS via a fifth node connecting its gate and drain terminals; a fourth PMOS having a source terminal connected to the VDD voltage, a gate terminal connected to the second node, and a drain terminal connected to the fourth node; a fifth NMOS having a drain terminal connected to the fourth node, a gate terminal connected to the fifth node, and a source terminal connected to the ground; and a capacitor connected between the fourth node and the ground.

The features and advantages of the present invention will become apparent from the following description with reference to the accompanying drawings.

Prior to the detailed description of the invention, it should be understood that the terms and words used in the specification and the claims are not to be construed as having common and dictionary meanings but are construed as having meanings and concepts corresponding to the technical spirit of the present invention in view of the principle that the inventor can define properly the concept of the terms and words in order to describe his/her invention with the best method.

The system of the present invention is constructed to pre-charge a storage capacitor with energy to be consumed for health check of the storage capacitor. This construction enables supply of sufficient energy even in an emergency power situation that may arise during the health check of the storage capacitor.

In addition, the system of the present invention is constructed to increase the precision of correlation between a sink current and a clock frequency. This construction can minimize energy consumption during the health check of the storage capacitor.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Figure 1:
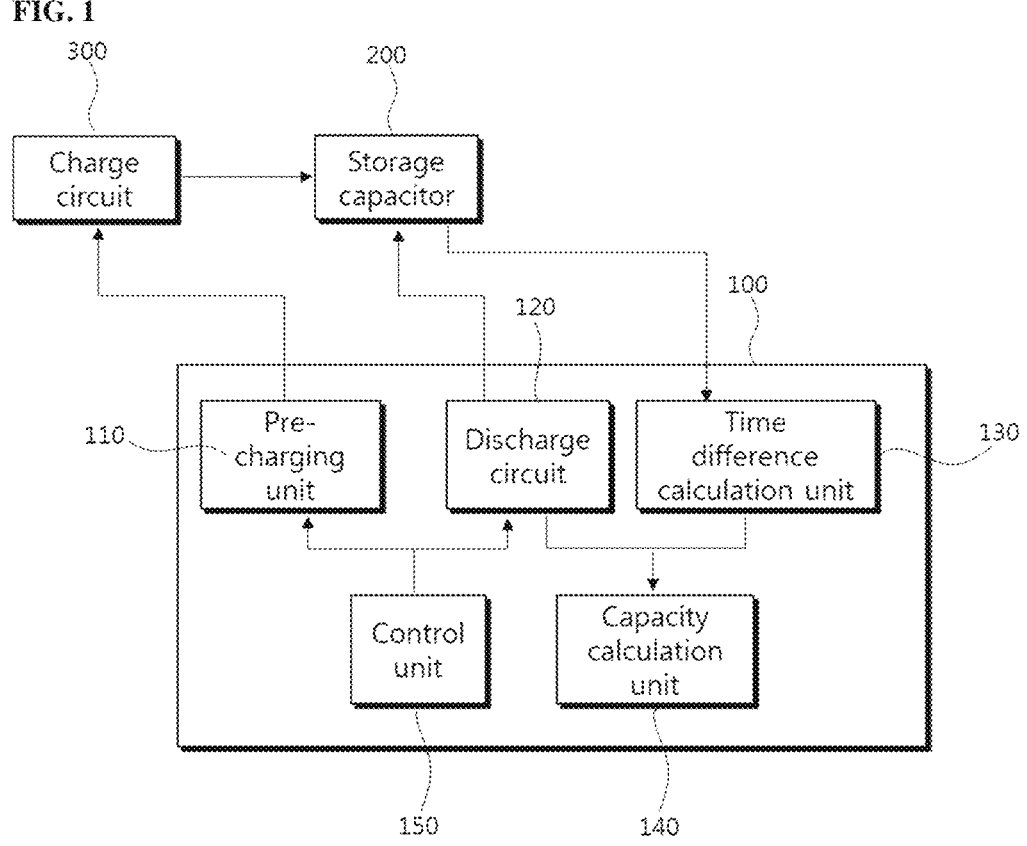
FIG. 1 is a block diagram illustrating a system for checking the capacity of a storage capacitor according to an embodiment of the present invention.

The objects, specific advantages, and novel features of the present invention will become apparent from the following detailed description and preferred embodiments in conjunction with the accompanying drawings. It should be noted that in the drawings, the same components are denoted by the same reference numerals even though they are depicted in different drawings. Although such terms as "first" and "second," etc. may be used to describe various components, these components should not be limited by above terms. These terms are used only to distinguish one component from another. In the description of the present invention, detailed explanations of related art are omitted when it is deemed that they may unnecessarily obscure the essence of the present invention.

Preferred embodiments of the present invention will now be described in detail with reference to the accompanying drawings.

Figure 2:
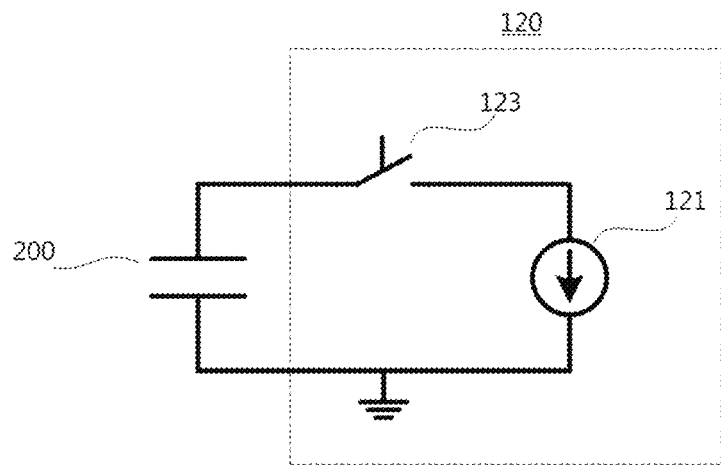
FIG. 2 is a circuit diagram illustrating a discharge circuit of a system for checking the capacity of a storage capacitor according to an embodiment of the present invention.
Figure 3:
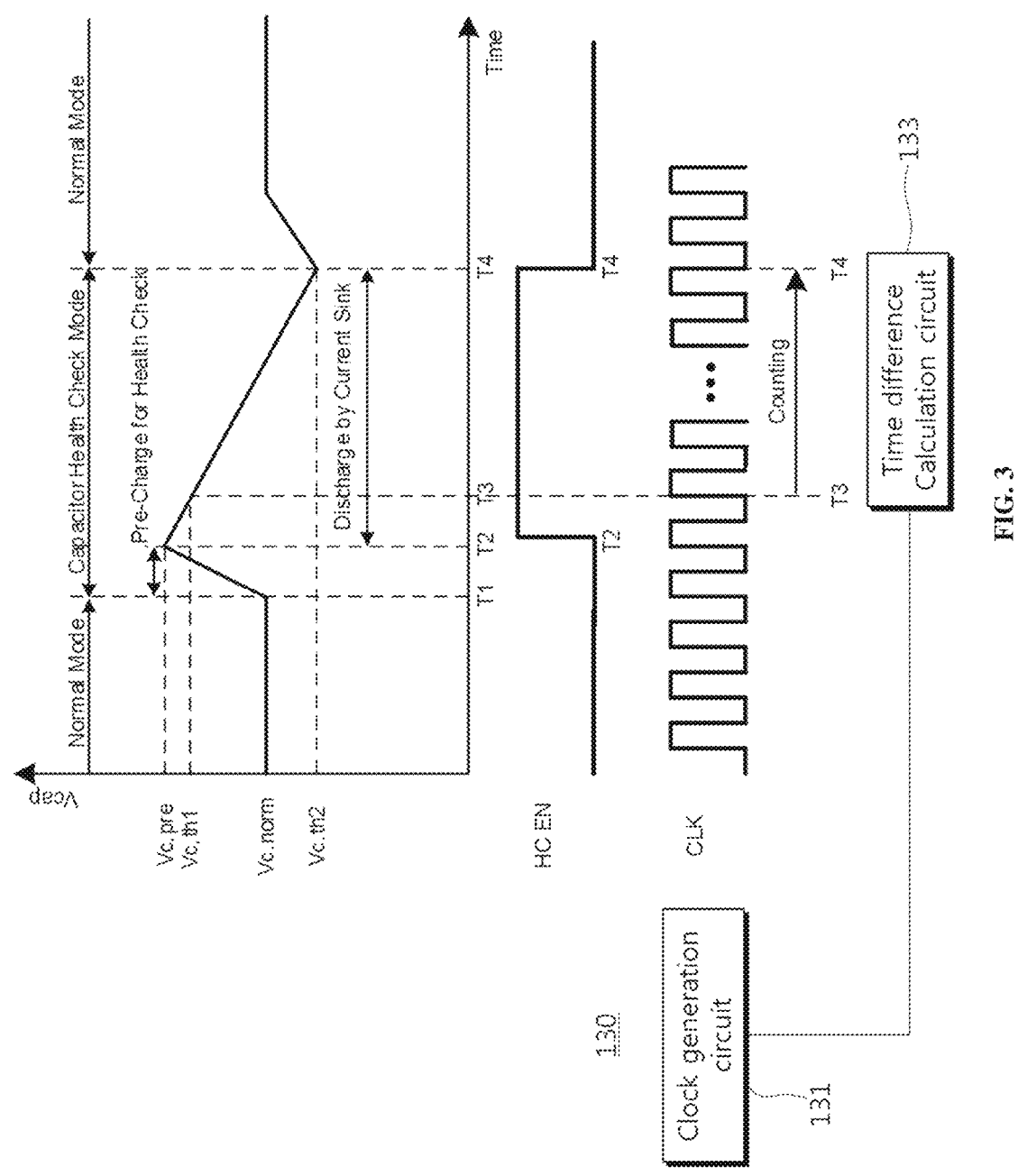
FIG. 3 is a diagram for explaining a capacity check method using a system for checking the capacity of a storage capacitor according to an embodiment of the present invention.

FIG. 1 is a block diagram illustrating a system for checking the capacity of a storage capacitor according to an embodiment of the present invention, FIG. 2 is a circuit diagram illustrating a discharge circuit of the system of FIG. 1, and FIG. 3 is a diagram for explaining a capacity check method using the system of FIG. 1.

As illustrated in FIGS. 1 to 3, the system 100 is constructed to check the capacity of a storage capacitor 200 charged by a charge circuit 300 for a predetermined time (from T1 to T4) and includes: a pre-charging unit 110 pre-charging the storage capacitor 200 to boost the voltage of the storage capacitor 200 at the first time point (T1); a discharge circuit 120 generating a sink current to discharge the storage capacitor 200 from the second time point (T2) so that the boosted voltage of the storage capacitor 200 is stepped down; a time difference calculation unit 130 calculating the time difference (T4–T3) between the third time point (T3) when the voltage of the storage capacitor 200 is stepped down to a predetermined first voltage and the fourth time point (T4) when the voltage of the storage capacitor 200 is continuously stepped down to a predetermined second voltage; a capacity calculation unit 140 calculating the capacity of the storage capacitor 200 based on the sink current and the time difference; and a control unit 150 controlling the operations of the pre-charging unit 110 and the discharge circuit 120.

The present invention is directed to a technology for checking the capacity of a storage capacitor 200 of a power loss protection circuit that stores energy in a normal power supply state and supplies the charged energy as emergency power when the power supply is cut off.

In general, a memory system including memory devices and a memory controller operates when power is supplied from the outside. Thus, data being processed may be lost when the power supply to the memory system is unintentionally cut off. As an example, the main system may be a solid state drive (SSD) or may consist of elements in the SSD. An SSD is a semiconductor-based storage device and may include a power loss protection integrated circuit that can supply emergency power to prevent data being processed from being lost even in an unintentional sudden power cut off situation. In this case, the power loss protection integrated circuit supplies power to a power management device such as a PMIC in an SSD and supports such that data are stably stored in a NAND flash memory. The power loss protection integrated circuit is an integrated circuit constructed such that power is supplied to the main system and at the same time a portion of the power is used to store energy in the storage capacitor 200 in a situation in which the power is normally supplied from the external power source and the energy stored in the storage capacitor 200 is used to supply emergency power to the main system in an emergency situation in which the power supply is cut off.

The amount of energy required in an emergency power situation is proportional to the capacity of the storage capacitor 200 and the performance (for example, maximum charge capacity) of the storage capacitor deteriorates depending on various factors such as operating voltage, temperature, humidity, and duration of use. Thus, the charge capacity of the storage capacitor 200 needs to be inspected regularly. This regular inspection is called a "status check" or "health check". A discharge circuit is generally used for health check to determine the capacity of the capacitor. The discharge circuit discharges the storage capacitor 200 for a predetermined time to determine whether the voltage of the storage capacitor 200 is higher than a critical voltage. In this process, the discharge circuit is affected by the operating environment such as temperature, failing to ensure its accuracy for health check. When the capacity of the storage capacitor 200 is very large, a large current sink is required to determine the capacity of the storage capacitor 200. As a result, a large amount of energy accumulated in the storage capacitor 200 for an emergency power situation is consumed, causing deterioration in the efficiency and performance of a memory system. The present invention has been devised to solve these problems.

Specifically, the system 100 checks the capacity of a storage capacitor 200 for a predetermined time (from T1 to T4). The system 100 includes a pre-charging unit 110, a discharge circuit 120, a time difference calculation unit 130, a capacity calculation unit 140, and a control unit 150, as described above.

The storage capacitor 200 is an object to be checked by the system 100 and is charged by a charge circuit 300. The charge circuit 300 charges the storage capacitor 200 in a normal situation where power is supplied from an external power source.

The pre-charging unit 110 performs pre-charging of the storage capacitor 200 at the first time point (T1) among the checking times (T1 to T4). The pre-charging increases the voltage of the storage capacitor 200 to a higher level than the voltage ($V_{C,norm}$) in a normal situation. At this time, the increased voltage ($V_{C,pre}$) is within a range that ensures stable operation of the storage capacitor 200, taking into account the tolerance of the storage capacitor 200. The pre-charging unit 110 induces the charge circuit 300, which charges the storage capacitor 200 in a normal situation, to perform pre-charging of the storage capacitor 200. Alternatively, the pre-charging unit 110 may be provided with a separate charge circuit to self-pre-charge the storage capacitor 200 instead of the charge circuit 300.

During the health check of the storage capacitor, the storage capacitor 200 is discharged by the discharge circuit 120, which will be described below. Since the discharge of the storage capacitor 200 incurs energy consumption, the pre-charging of the storage capacitor 200 by the pre-charging unit 110 enables supply of sufficient energy as emergency power even if an emergency power situation arises during the checking time.

The discharge circuit 120 steps down the voltage ($V_{C,pre}$) of the pre-boosted storage capacitor 200 from the second time point (T2) after the lapse of some time from the first time point (T1) (that is, from when the pre-charging by the pre-charging unit 110 is finished) to the fourth time point (T4). The discharge circuit 120 for stepping down the voltage of the storage capacitor 200 generates a sink current to discharge the storage capacitor 200.

For example, the discharge circuit 120 may include a current sink 121 and a switching unit 123 (see FIG. 2). The current sink 121 is electrically connected to the storage capacitor 200 to generate a sink current and the switching unit 123 turns on/off the current sink 121 to control the operation of the current sink, enabling discharge of the storage capacitor 200 in the on state. The current sink 121 can be embodied in various forms and its related embodiments are described below.

The time difference calculation unit 130 calculates the time interval between when the stepped-down voltage of the storage capacitor 200 reaches a predetermined first voltage ($V_{c,th1}$) and when it reaches a second voltage ($V_{c,th2}$). The first voltage ($V_{c,th1}$) and the second voltage ($V_{c,th2}$) may be preset. The reason for this voltage difference is to mask a non-linear operation upon initial connection of the current sink 121.

The third time point (T3) corresponds to the time point when the voltage of the storage capacitor 200 is stepped down to the first voltage ($V_{c,th1}$) and the fourth time point (T4) corresponds to the time point when the voltage of the storage capacitor is continuously stepped down to the second voltage ($V_{c,th2}$). The time difference calculation unit 130 calculates the time difference between when the voltage versus time curve passes through the first voltage ($V_{c,th1}$) (that is, the third time point (T3)) and when it passes through the second voltage ($V_{c,th2}$) (that is, the fourth time point (T4)) (=T4–T3). This time difference can be measured in various ways, and it is not limited to a specific measurement method. For example, the time difference may be measured based on clock signals. In this case, the time difference calculation unit 130 may be implemented by a clock generation circuit 131 and a time difference calculation circuit 133 (see FIG. 3). The clock generation circuit 131 generates clock signals and the time difference calculation circuit 133 counts the period of the clock signals from the third time point (T3) to the fourth time point (T4) to calculate the time difference (T4–T3). Here, the relation between the period of the clock signals and the time difference is given by Equation 1:

$$(T4 - T3) = K \times T_0 \qquad (1)$$

where (T4–T3) is the time difference, $T_0$ is the period of the clock signals, and K is the number of clock periods counted from the third time point (T3) to the fourth time point (T4).

The predetermined checking times (T1 to T4) are determined based on the times when the pre-charging unit 110, the discharge circuit 120, and the time difference calculation unit 130 operate. Indeed, the checking may be performed earlier than the first time point (T1) or even after the fourth time point (T4).

The voltage of the storage capacitor 200, which is boosted and stepped down by the pre-charging unit 110 and the discharge circuit 120, respectively, is measured by the pre-charging unit 110 and the discharge circuit 120. Alternatively, a separate voltage measurement circuit may be provided to measure the voltage of the storage capacitor 200.

The capacity calculation unit 140 calculates the capacity of the storage capacitor 200 based on the sink current and the time difference according to Equation 2:

$$C_{STR} = \frac{I_{sink} \times (T4 - T3)}{V_{c,th1} - V_{c,th2}} \qquad (2)$$
$$= \frac{K \times T_0 \times I_{sink}}{V_{c,th1} - V_{c,th2}}$$

where $C_{STR}$ is the capacity of the storage capacitor, $I_{sink}$ is the sink current, $V_{c,th1}$ is the first voltage of the storage capacitor, $V_{c,th2}$ is the second voltage of the storage capacitor, T3 is the time point when the voltage of the storage capacitor reaches the first voltage, T4 is the time point when the voltage of the storage capacitor reaches the second voltage, $T_0$ is the period of the clock signals, and K is the number of clock periods counted from the third time point (T3) to the fourth time point (T4).

Referring to Equation 2, since the first voltage ($V_{c,th1}$), the second voltage ($V_{c,th2}$), and the sink current ($I_{sink}$) are predetermined at the time of circuit design, the capacity of the storage capacitor 200 is proportional to the period of the clock signals and can be calculated through the K value, which is a multiple of the clock signal.

The control unit 150 controls the operations of the pre-charging unit 110 and the discharge circuit 120. That is, the pre-charge and discharge operations of the storage capacitor 200 are controlled in response to control signals from the control unit 150.

Each of the pre-charging unit 110, the discharge circuit 120, the time difference calculation unit 130, the capacity calculation unit 140, and the control unit 150 may be implemented by hardware and/or software. Since these system components are functionally distinguished, they may share specific hardware or software.

Embodiments of the discharge circuit 120 and the clock generation circuit 131 will be described below.

As discussed above, the capacity of the storage capacitor 200 is calculated based on the sink current ($I_{sink}$), the first voltage ($V_{c,th1}$), the second voltage ($V_{c,th2}$), and the period of the clock signals, which are predetermined at the time of design. Unlike the first and second voltages that are insensitive to the operating environment, the sink current and the period of the clock signals may vary sensitively to the operating environment. Thus, an increase in the precision of correlation between the sink current and the clock frequency is required to increase the resolution of the circuits for health check of the storage capacitor. The increased precision of correlation between the sink current and the clock frequency makes the difference between the predetermined first and second voltages small. This can save energy consumed to check the health of the storage capacitor, leading to improvements in the efficiency and performance of a memory systems such as an SSD module.

The discharge circuit 120 and the clock generation circuit 131 designed for this purpose will be described below. Due to these designs, a sink current and a clock frequency can be generated using a single current source to increase the precision of correlation therebetween, enabling the system to check the capacity of the storage capacitor with high resolution.

Figure 4:
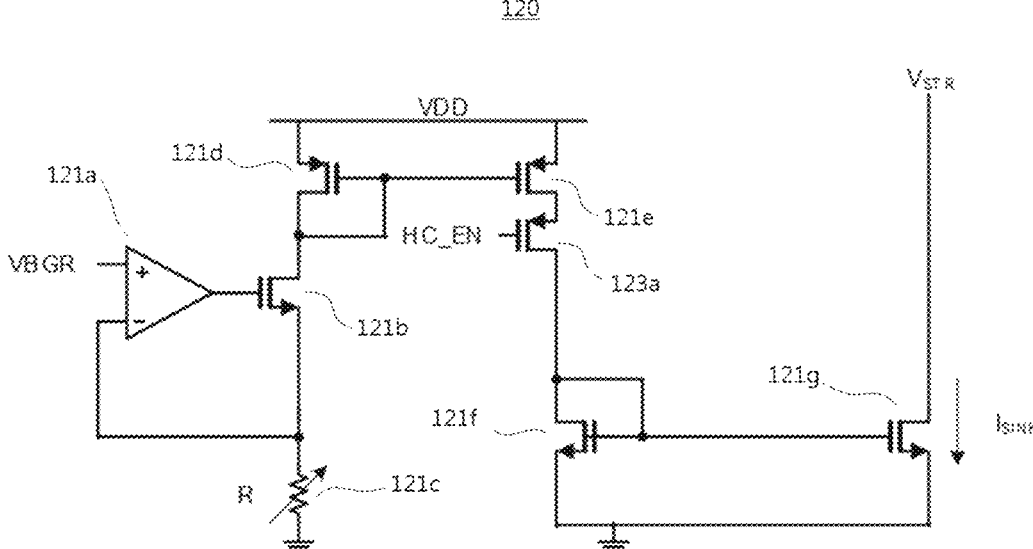
FIG. 4 is a circuit diagram illustrating a discharge circuit of a system for checking the capacity of a storage capacitor according to a further embodiment of the present invention.

FIG. 4 is a circuit diagram illustrating a discharge circuit of a system for checking the capacity of a storage capacitor according to a further embodiment of the present invention.

As illustrated in FIG. 4, the discharge circuit 120 includes an OP-AMP 121a, a first NMOS 121b, a variable resistor 121c, a first PMOS 121d, a second PMOS 121e, a switching PMOS 123a, a second NMOS 121f, and a third NMOS 121g. The PMOSs and the NMOSs represent P-channel MOSFETs and N-channel MOSFETs, respectively. Each of the PMOSs and the NMOSs has a source terminal, a drain terminal, and a gate terminal.

The OP-AMP 121a is an operational amplifier and has a non-inverting (+) input end, an inverting (−) input end, and an output end. A first reference voltage is applied to the non-inverting (+) input end. The first reference voltage may be a band-gap reference voltage (VBGR) output from a band-gap reference voltage generator. The band-gap reference voltage generator may use a band-gap reference voltage as the first reference voltage to output a constant voltage regardless of temperature and power supply voltage.

The output end of the OP-AMP 121a is connected to the gate terminal of the first NMOS 121b and the inverting (−) input end of the OP-AMP 121a is connected to the source terminal of the first NMOS 121b via a first node.

The variable resistor 121c is connected between the first node and a ground.

The source terminal of the first PMOS 121d is connected to a VDD voltage and is connected to the drain terminal of the first NMOS 121b via a second node connecting the drain and gate terminals of the first PMOS 121d.

The second node is connected to the gate terminal of the second PMOS 121e and the source terminal of the second PMOS 121e is connected to the VDD voltage.

The switching PMOS 123a is a constituent element of the switching unit 123 and its source terminal is connected to the drain terminal of the second PMOS 121e.

The drain and gate terminals of the second NMOS 121f are connected to the drain terminal of the switching PMOS 123a via a third node, and the source terminal of the second NMOS 121f is connected to the ground.

The drain terminal of the third NMOS 121g is connected to the storage capacitor 200, the gate terminal of the third NMOS 121g is connected to the third node, and the source terminal of the third NMOS 121g is connected to the ground.

The discharge circuit 120 is a voltage-to-current converter circuit to generate a sink current ($I_{sink}$). The sink current is defined as the ratio of a current mirror consisting of the first PMOS 121d and the second PMOS 121e to a current mirror consisting of the second NMOS 121f and the third NMOS 121g. When the widths/lengths of the first PMOS 121d, the second PMOS 121e, the second NMOS 121f, and the third NMOS 121g are defined as WP1/LP1, WP2/LP2, WN2/LN2, and WN3/LN3, respectively, the sink current ($I_{sink}$) can be expressed by Equation 3:

$$I_{sink} = VBGR/R \times \left((W_{P2}/L_{P2})/(W_{P1}/L_{P1})\right) \times \left((W_{N3}/L_{N3})/(W_{N2}/L_{N2})\right) \quad (3)$$

where $I_{sink}$ is the sink current, VBGR is the first reference voltage, and R is the resistance of the variable resistor.

Referring to Equation 3, the sink current is inversely proportional to the variable resistance. Generally, the band-gap reference voltage and the W/L ratios of the current mirrors do not vary sensitively depending on process variations, operating environment, and duration of use but the resistance of the variable resistor varies sensitively depending on these factors. Thus, the circuit needs to be corrected before actual use in order to obtain the accurate sink current ($I_{sink}$).

Figure 5:
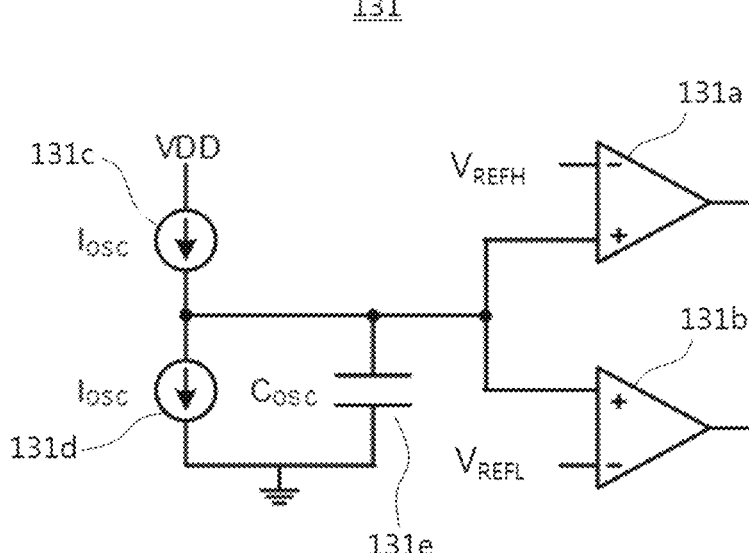
FIG. 5 is a circuit diagram illustrating a clock generation circuit of a system for checking the capacity of a storage capacitor according to an embodiment of the present invention.

FIG. 5 is a circuit diagram illustrating the clock generation circuit of the system of FIG. 1.

Referring to FIG. 5, the clock generation circuit 131 has a structure in which current sources and a capacitor are used to generate clock signals. Specifically, the clock generation circuit 131 includes a first comparator 131a, a second comparator 131b, a first current source 131c, a second current source 131d, and a capacitor 131e.

A second reference voltage ($V_{REFH}$) is applied to an inverting (−) input terminal of the first comparator 131a and a third reference voltage ($V_{REFL}$) is applied to an inverting (−) input terminal of the second comparator 131b. The non-inverting (+) input terminal of the first comparator 131a and the non-inverting (+) input terminal of the second comparator 131b are connected to each other via a fourth node.

The first current source 131c is connected between the VDD voltage and the fourth node and the second current source 131d is connected between the fourth node and the ground. Each of the first current source 131c and the second current source 131d supplies a current ($I_{OSC}$).

The capacitor 131e is connected between the fourth node and the ground.

The fourth node moves with a constant slope between the second reference voltage ($V_{REFH}$) applied to the inverting (−) input terminal of the first comparator 131a and the third reference voltage ($V_{REFL}$) applied to the inverting (−) input terminal of the second comparator 131b. The period of the clock signals generated from the clock generation circuit 131 can be calculated according to Equation 4:

$$T_0 = \frac{C_{OSC} \times (V_{REFH} - V_{REFL})}{I_{OSC}} \quad (4)$$

where $T_0$ is the period of the clock signals, $C_{OSC}$ is the capacity of the capacitor 131e, $V_{REFH}$ is the second reference voltage, $V_{REFL}$ is the third reference voltage, and $I_{OSC}$ is the current of the current source.

$V_{REFH}$ and $V_{REFL}$ in Equation 4 do not vary sensitively depending on process variations, operating environment, and duration of use but the capacitor 131e, the first current source 131c, and the second current source 131d varies sensitively depending on these factors. Thus, the circuit needs to be corrected before actual use in order to generate the accurate period of the clocks.

Figure 6:
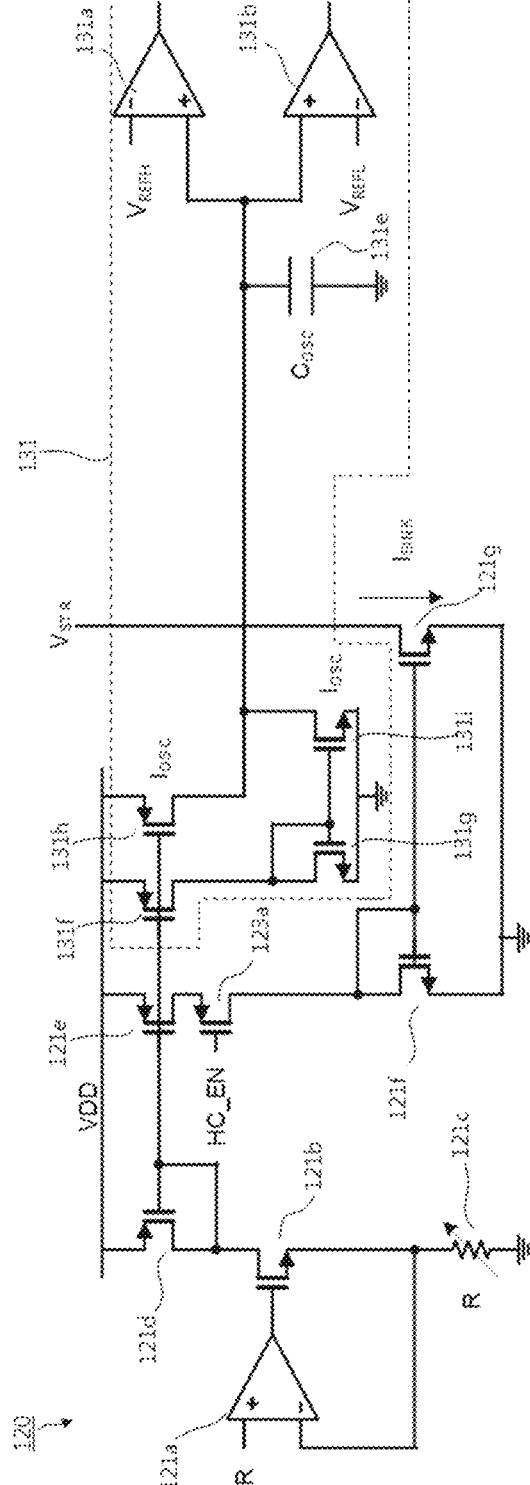
FIG. 6 is a circuit diagram illustrating a clock generation circuit of a system for checking the capacity of a storage capacitor according to a further embodiment of the present invention.

FIG. 6 is a circuit diagram illustrating a clock generation circuit 131 of the system 100 of FIG. 4.

As illustrated in FIG. 6, the clock generation circuit 131 uses a discharge circuit 120 having a voltage-current converter structure to generate the current ($I_{OSC}$) supplied from the current source of the clock generation circuit 131 according to the previous embodiment (see FIG. 5). The structure of the discharge circuit 120 has been described with reference to FIG. 4.

Specifically, the clock generation circuit 131 includes a first comparator 131a, a second comparator 131b, a third PMOS 131f, a fourth NMOS 131g, and a fourth PMOS 131h, a fifth NMOS 131i, and a capacitor 131e.

The clock generation circuit 131 is coupled to the discharge circuit 120. The voltage-current converter structure of the discharge circuit 120 has been described above and a repeated explanation is omitted or simplified.

A second reference voltage ($V_{REFH}$) is applied to an inverting (−) input terminal of the first comparator 131a and a third reference voltage ($V_{REFL}$) is applied to an inverting (−) input terminal of the second comparator 131b. A non-inverting (+) input terminal of the first comparator 131a and a non-inverting (+) input terminal of the second comparator 131b are connected to each other via a fourth node.

The third PMOS 131f has a source terminal connected to the VDD voltage and a gate terminal connected to the second node connecting the first PMOS 121d, the first NMOS 121b, and the second PMOS 121e.

The fourth NMOS 131g has a gate terminal and a drain terminal connected to each other via a fifth node to which a drain terminal of the third PMOS 131f is connected. A source terminal of the fourth NMOS 131g is connected to the ground.

The fourth PMOS 131h has a source terminal connected to the VDD voltage, a gate terminal connected to the second node, and a drain terminal connected to the fourth node.

The fifth NMOS 131i has a drain terminal connected to the fourth node, a gate terminal connected to the fifth node, and a source terminal connected to the ground.

The capacitor 131e is connected between the fourth node and the round.

As described above, a single current source is used instead of a current source necessary in the clock generation circuit and a current source necessary for sink current generation to increase the precision of correlation between the clock frequency as an output from the clock generation circuit and the sink current source, making it possible to measure the capacity of the storage capacitor 200 regardless of $I_{OSC}$ and $I_{SINK}$ values, which vary sensitively depending on process variations, operating environment, and duration of use in the previous embodiment.

The period of the clock signals can be calculated according to Equation 5:

$$T_0 = \frac{C_{OSC} \times (V_{REFH} - V_{REFL})}{I_{OSC}}$$
$$= \frac{R \times C_{OSC} \times (V_{REFH} - V_{REFL})}{VBGR} \quad (5)$$

where $T_0$ is the period of the clock signals, VBGR is the first reference voltage, R is the resistance of the variable resistor 121c, $V_{REFH}$ is the second reference voltage, and $V_{REFL}$ is the third reference voltage.

The sink current ($I_{SINK}$) can be calculated according to Equation 6:

$$I_{sink} = \alpha \times \frac{VBGR}{R} \quad (6)$$

where $I_{sink}$ is the sink current, VBGR is the first reference voltage, R is the resistance of the variable resistor 121c, and $\alpha$ is a coefficient.

Equations 5 and 6 can be substituted into Equation 2 to calculate the capacity of the storage capacitor 200, as expressed by Equation 7:

$$C_{STR} = \frac{K \times \alpha \times C_{OSC} \times (V_{REFH} - V_{REFL})}{V_{c,th1} - V_{c,th2}} \quad (7)$$

where $C_{STR}$ is the capacity of the storage capacitor, K is the number of clock periods counted from the third time point (T3) to the fourth time point (T4), $\alpha$ is a coefficient, $C_{OSC}$ is the capacity of the capacitor, $V_{REF}H$ is the second reference voltage, $V_{REFL}$ is the third reference voltage, $V_{c,th1}$ is the first voltage of the storage capacitor, and $V_{c,th2}$ is the second voltage of the storage capacitor.

As expressed in Equation 7, the capacity of the storage capacitor 200 is calculated only based on $C_{OSC}$, $V_{REFH}$, $V_{REFL}$, $V_{c,th1}$, and $V_{c,th2}$ that are predetermined at the time of design, making it possible to check the capacity of the storage capacitor 200 with high resolution.

Overall, the system of the present invention is constructed to pre-charge a storage capacitor with energy to be consumed for health check of the storage capacitor. This construction enables supply of sufficient energy even in an emergency power situation that may arise during the health check of the storage capacitor. In addition, the system of the present invention is constructed to increase the precision of correlation between a sink current and a clock frequency. This construction can minimize energy consumption during the health check of the storage capacitor.

Although the present invention has been described herein with reference to the foregoing specific embodiments, these embodiments do not serve to limit the invention and are set forth for illustrative purposes. It will be apparent to those skilled in the art that modifications and improvements can be made without departing from the spirit and scope of the invention.

Simple modifications and changes of the present invention belong to the scope of the present invention and the specific scope of the present invention will be clearly defined by the appended claims.

What is claimed is:

1. A system for checking the capacity of a storage capacitor charged by a charge circuit for a predetermined time, comprising: a pre-charging unit pre-charging the storage capacitor to boost the voltage of the storage capacitor at the first time point (T1); a discharge circuit generating a sink current to discharge the storage capacitor from the second time point (T2) so that the boosted voltage of the storage capacitor is stepped down; a time difference calculation unit calculating the time difference (T4–T3) between the third time point (T3) when the voltage of the storage capacitor is stepped down to a predetermined first voltage and the fourth time point (T4) when the voltage of the storage capacitor is continuously stepped down to a predetermined second voltage; a capacity calculation unit calculating the capacity of the storage capacitor based on the sink current and the time difference; and a control unit controlling the operations of the pre-charging unit and the discharge circuit, wherein the discharge circuit comprises a current sink electrically connected to the storage capacitor and a switching unit turning on/off the current sink, wherein the discharge circuit comprises: an OP-AMP having a non-inverting (+) input end to which a first reference voltage is applied; a first NMOS having a gate terminal connected to an output end of the OP-AMP; a variable resistor connected between a first node connecting an inverting (−) input end of the OP-AMP and a source terminal of the first NMOS and a ground; a first PMOS having a source terminal connected to a VDD voltage and connected to a drain terminal of the first NMOS via a second node connecting its drain and gate terminals; a second PMOS having a source terminal connected to the VDD voltage and a gate terminal connected to the second node; a switching PMOS constituting the switching unit and having a source terminal connected to a drain terminal of the second PMOS; a second NMOS connected to a drain terminal of the switching PMOS via a third node connecting its drain and gate terminals and having a source terminal connected to the ground; and a third NMOS having a drain terminal connected to the storage capacitor, a gate terminal connected to the third node, and a source terminal connected to the ground, and wherein the time difference calculation unit comprises a clock generation circuit comprising: a first comparator having an inverting (−) input terminal to which a second reference voltage is applied; a second comparator having an inverting (−) input terminal to which a third reference voltage is applied and a non-inverting (+) input terminal connected to a non-inverting (+) input terminal of the first comparator via a fourth node; a third PMOS having a source terminal connected to the VDD voltage and a gate terminal connected to the second node; a fourth NMOS having a source terminal connected to the ground and connected to a drain terminal of the third PMOS via a fifth node connecting its gate and drain terminals; a fourth PMOS having a source terminal connected to the VDD voltage, a gate terminal connected to the second node, and a drain terminal connected to the fourth node; a fifth NMOS having a drain terminal connected to the fourth node, a gate terminal connected to the fifth node, and a source terminal connected to the ground; and a capacitor connected between the fourth node and the ground.

2. The system according to claim 1, wherein the first reference voltage is a band-gap reference voltage output from a band-gap reference voltage generator.

* * * * *